(12) United States Patent
Yu

(10) Patent No.: US 6,420,218 B1
(45) Date of Patent: Jul. 16, 2002

(54) ULTRA-THIN-BODY SOI MOS TRANSISTORS HAVING RECESSED SOURCE AND DRAIN REGIONS

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/559,368

(22) Filed: Apr. 24, 2000

(51) Int. Cl.[7] .............................................. H01L 21/335
(52) U.S. Cl. ..................... 438/142; 438/155; 438/200; 438/225; 438/259; 438/589
(58) Field of Search ............................. 438/155, 142, 438/200, 225, 259, 589

(56) References Cited

U.S. PATENT DOCUMENTS

| | | | |
|---|---|---|---|
| 4,683,645 A | 8/1987 | Naguib et al. | 438/297 |
| 4,745,082 A | 5/1988 | Kwok | 438/178 |
| 4,784,718 A | 11/1988 | Mitani et al. | 438/183 |
| 5,017,504 A | 5/1991 | Nishimura et al. | 438/269 |
| 5,264,382 A | 11/1993 | Watanabe | 438/180 |
| 5,270,232 A | 12/1993 | Kimura et al. | 438/304 |
| 5,349,228 A * | 9/1994 | Neudeck et al. | 257/365 |
| 5,374,575 A | 12/1994 | Kim et al. | 438/291 |
| 5,391,510 A | 2/1995 | Hsu et al. | 438/301 |
| 5,393,685 A | 2/1995 | Yoo et al. | 438/231 |
| 5,429,956 A | 7/1995 | Shell et al. | 438/291 |
| 5,434,093 A | 7/1995 | Chau et al. | 438/300 |
| 5,478,776 A | 12/1995 | Luftman et al. | 438/301 |
| 5,538,913 A | 7/1996 | Hong | 438/282 |
| 5,576,227 A | 11/1996 | Hsu | 438/291 |
| 5,593,907 A | 1/1997 | Anjum et al. | 438/298 |
| 5,607,884 A | 3/1997 | Byun | 438/297 |
| 5,668,397 A * | 9/1997 | Davis et al. | 257/520 |
| 5,675,159 A | 10/1997 | Oku et al. | 257/284 |
| 5,716,861 A | 2/1998 | Moslehi | 438/231 |
| 5,726,081 A * | 3/1998 | Lin et al. | 438/163 |
| 5,736,435 A | 4/1998 | Venkatesan et al. | 438/151 |
| 5,793,090 A | 8/1998 | Gardner et al. | 257/408 |
| 5,801,075 A | 9/1998 | Gardner et al. | 438/197 |
| 5,811,323 A | 9/1998 | Miyasaka et al. | 438/151 |
| 5,814,544 A | 9/1998 | Huang | 438/291 |
| 5,817,558 A | 10/1998 | Wu | 438/291 |
| 5,824,586 A | 10/1998 | Wollesen et al. | 438/300 |
| 5,825,066 A | 10/1998 | Buynoski | 257/300 |
| 5,856,225 A | 1/1999 | Lee et al. | 438/291 |

(List continued on next page.)

FOREIGN PATENT DOCUMENTS

| | | |
|---|---|---|
| JP | 3-248433 | 11/1991 |
| JP | 4-123439 | 4/1992 |
| JP | 5-160396 | 6/1993 |

OTHER PUBLICATIONS

"Sub 50–nm Fin FET: PMOS", Huang, et al. 1999 IEEE.
Ultra–Thin–Body Silicon–On–Insulator MOSFET's for Terabit–Scale Integration Yu, et al. Department of Electrical Engineering and Computer Sciences, University of California Berkeley.
International Electronic Devices Meeting "Sub–100nm Gate Length Metal Gate NMOS Transistors Fabricated by a Replacement Gate Process", Chatterjee, et al. Dec. 7–10, 1997, IEEE.

Primary Examiner—Son T. Dinh
Assistant Examiner—Pho Luu
(74) Attorney, Agent, or Firm—Foley & Lardner

(57) ABSTRACT

An ultra-large-scale integrated (ULSI) circuit includes MOSFETs on an SOI substrate. The MOSFETs include recessed source and drain regions. The recessed source and drain regions are formed utilizing an amorphous semiconductor layer. The recessed source and drain regions allow sufficient material for silicidation and yet allow an ultra thin channel region to be utilized. The channel region is above an insulative island.

19 Claims, 2 Drawing Sheets

U.S. PATENT DOCUMENTS

| | | | |
|---|---|---|---|
| 5,858,843 A | 1/1999 | Doyle et al. | 438/299 |
| 5,904,530 A | 5/1999 | Shin | 438/291 |
| 5,915,180 A | 6/1999 | Hara et al. | 438/270 |
| 5,915,182 A | 6/1999 | Wu | 438/299 |
| 5,915,183 A | 6/1999 | Gambino et al. | 438/300 |
| 5,937,297 A | 8/1999 | Peidous | 438/270 |
| 5,953,602 A | 9/1999 | Oh et al. | 438/201 |
| 5,972,754 A | 10/1999 | Ni et al. | 438/270 |
| 5,998,288 A | 12/1999 | Gardner et al. | 438/589 |
| 6,190,952 B1 * | 2/2001 | Xiang et al. | 438/155 |

* cited by examiner

ULTRA-THIN-BODY SOI MOS TRANSISTORS HAVING RECESSED SOURCE AND DRAIN REGIONS

CROSS REFERENCE TO RELATED APPLICATIONS

This patent application is related to U.S. application Ser. No. 09/397,217 filed by Yu, et al. on Sep. 16, 1999, entitled "Source/Drain Doping Technique for Ultra-Thin-Body SOI MOS Transistors", U.S. application Ser. No. 09/187,630, filed on Nov. 6, 1998, by Yu entitled "Dual Amorphization Implant Process for Ultra-Shallow Drain and Source Extensions", U.S. application Ser. No. 09/187,890 filed on Nov. 6, 1998 now U.S. Pat No. 6,180,476 by Yu, et al. entitled "A Method of Fabricating an Integrated Circuit with Ultra-Shallow Source/Drain Extensions", and U.S. application Ser. No. 09/187,172, filed on Nov. 6, 1998 now U.S. Pat. No. 6,255,173, by Yu entitled "Recessed Channel Structure for Manufacturing Shallow Source Drain Extension", all assigned to the assignee of the present application.

FIELD OF THE INVENTION

The present invention relates to integrated circuits (ICs) and methods of manufacturing integrated circuits. More particularly, the present invention relates to integrated circuits having transistors with recessed source/drain regions and methods of manufacturing such integrated circuits.

BACKGROUND OF THE INVENTION

Currently, deep-submicron complementary metal oxide semiconductor (CMOS) is the primary technology for ultra-large scale integrated (ULSI) devices. Over the last two decades, reduction in the size of CMOS transistors has been a principal focus of the microelectronics industry. However, as the sizes of the various components of the transistor are reduced, operational parameters and performance characteristics can change. Appropriate transistor performance must be maintained as transistor size is decreased.

The ULSI circuit can include CMOS field effect transistors (FETs). The transistors can include semiconductor gates disposed between drain and source regions. The drain and source regions are typically heavily doped with a P-type dopant (e.g., boron) or an N-type dopant (e.g., phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Controlling short-channel effects is particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region (i.e., a region just below the top surface of the substrate and to the sides of the gate structure) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form deeper source and drain regions. The source and drain extensions are not further doped due to the blocking capability of the silicon dioxide spacer.

As transistors disposed on ICs become smaller, transistors with shallow and ultra-shallow source/drain extensions have become more difficult to manufacture. For example, smaller transistors should have ultra-shallow source and drain extensions with less than 30 nanometer (nm) junction depth. Forming source and drain extensions with junction depths of less than 30 nm is very difficult using conventional fabrication techniques. Conventional ion implantation and diffusion-doping techniques make transistors on the IC susceptible to short-channel effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extensions vertically into the bulk semiconductor substrate.

Transistors, such as, metal oxide semiconductor field effect transistors (MOSFETs), are generally either bulk semiconductor-type devices or silicon-on-insulator (SOI)-type devices. Most integrated circuits are fabricated in a CMOS process on a bulk semiconductor substrate.

In bulk semiconductor-type devices, transistors, such as, MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of the depletion layer below the inversion channel) must be scaled down to achieve superior short-channel performance.

Conventional SOI-type devices include an insulative substrate attached to a thin film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variation in small size transistor), near-ideal subthreshold voltage swing (i.e., good for low off-state current leakage), and high saturation current. As the physical gate length of MOS transistors shrink to dimensions of 50 nm and below, ultra-thin body MOSFETs fabricated on very thin SOI substrates provide significant architectural advantages. Ultra-thin body MOSFETs may be the enabling technology for terrabit-scale circuit integration (e.g., gate length <50 nm) due to its excellent immunity to short-channel effects, (such as threshold roll-off and drain induced barrier lowering), reduced subthreshold slope (60 mv/decade) and reduction of parasitic capacitance. The body thickness of such devices can be below 200 Angstroms (Å)

(e.g., less than 150 Å) to overcome the short-channel effects (e.g., threshold voltage roll-off and drain induced barrier lowering) which tend to be severe in devices with small dimensions.

A major process challenge for fully depleted (FD) SOI devices involves the formation of silicide layers on the source/drain junctions. The source/drain junction generally has the same thickness as the semiconductor film (the silicon layer on the SOI substrate). Semiconductor films on SOI substrates often have thicknesses of less than 150 Å for sub-50 nm devices. Silicide layers often require thicknesses of greater than 350 Å to appropriately reduce sheet resistance at the source/drain junction.

The source regions and drain regions of SOI devices can be raised by selective silicon (SI) epitaxy to make connections to source and drain contacts less difficult. The raised source and drain regions provide additional material for contact silicidation processes while the thinner film in the channel region (active body region) controls short channel effects and reduces subthreshold slope. However, the raised source and drain regions do not necessarily make conventional doping processing for source and drain junctions less challenging especially with respect to transistors with small gate lengths. The spacing between the source and drain regions in devices with gate lengths below 70 nm is extremely narrow (e.g., only 25–30 nm).

According to conventional doping techniques, the dopant (e.g., $CoSi_2$) implanted into the source and drain region must be activated at temperatures of 900–1100° C. for several seconds. The high thermal budget associated with conventional doping techniques can produce significant thermal diffusion which can cause a short between the source and drain region. Shorting between the source and drain region is a particular problem at small gate lengths.

Thus, there is a need for an integrated circuit electronic device which are not susceptible to short channel effects and high sheet resistance. Further still, there is a need for an SOI circuit that has transistors with thick source/drain regions and a thin active region. Even further still, there is a need for a method of manufacturing transistors with recessed source and drain regions. Yet further still, there is a need for an SOI integrated circuit with transistors having gate lengths of about 50 nm or less and recessed source/drain regions.

SUMMARY OF THE INVENTION

An exemplary embodiment relates to a method of manufacturing an integrated circuit including a transistor disposed on a substrate including a thin film. The method includes: forming one of a recessed source region and a recessed drain region on the substrate, and siliciding the one of the recessed source region and the recessed drain region.

Another embodiment relates to a semiconductor-on-insulator integrated circuit. The semiconductor-on-insulator integrated circuit includes a transistor which further includes a gate disposed between a recessed drain region and a recessed source region. A channel is disposed below the gate and between the recessed drain region and the recessed source region. The channel is less than 100 Å thick and the recessed drain region and the recessed source region are thicker than the channel.

Yet another embodiment relates to a method of manufacturing a ULSI circuit on a semiconductor-on-insulator substrate. The method includes selectively etching a semiconductor film to form an aperture, providing an insulative material in the aperture, providing a semiconductor layer over the insulating material and semiconductor film, and providing a gate on the semiconductor layer at a location above the insulative material.

BRIEF DESCRIPTION OF THE DRAWINGS

Exemplary embodiments will hereinafter be described with reference to the accompanying drawings, wherein like numerals denote like elements, and.

DETAILED DESCRIPTION OF THE PREFERRED EMBODIMENTS

Figure 1:
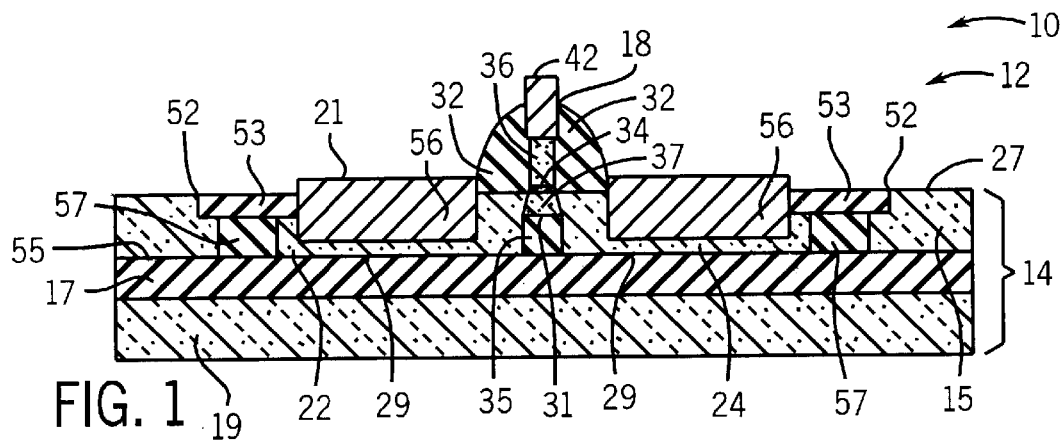
FIG. 1 is a cross-sectional view of a portion of an integrated circuit in accordance with an exemplary embodiment, the integrated circuit including a transistor provided on a semiconductor-on-insulator substrate.

With reference to FIG. 1, a transistor 12 is disposed on a semiconductor substrate 14, such as, a wafer. Semiconductor substrate 14 is preferably a semiconductor-on-insulator (SOI) substrate. Substrate 14 can be formed in a bonding and etch-back process or by an oxygen implantation process. Preferably, substrate 14 includes a thin film semiconductor layer 15, an insulative layer 17, and a semiconductive base layer 19. Alternatively, layer 15 can be disposed solely on an insulative layer 17.

Layer 17 can be a buried oxide layer provided upon base layer 19 of silicon. Layer 17 is preferably a buried silicon dioxide material and has a thickness of 1500–2500 Å. Layer 17 can be formed by oxygen implantation.

Layer 15 is preferably a thin layer of silicon originally having a thickness of 500–700 Å which has been polished down to approximately 300–500 Å and built back up to 350–600 Å before transistor 12 is completed. Layer 15 in FIG. 1 is a combination of layer 15 in FIG. 5 and layer 74 in FIG. 6. The formation of substrate 14 is described below in more detail with reference to FIGS. 1–7.

Transistor 12 is part of a portion 10 of an integrated circuit (IC) manufactured on a wafer (such as, a silicon wafer). Transistor 12 includes a gate structure 18, a recessed source region 22, and a recessed drain region 24. Regions 22 and 24 extend from a top surface 21 of silicide layers 56 (above a top surface 27 of layer 15) to a top surface 55 of layer 17. Regions 22 and 24 are approximately 350–780 Å thick (from surface 21 to surface 55 including silicide layers 56) and can include a source extension and a drain extension. Regions 22 and 24 are 350–600 Å thick at the thickest part (underneath spacers 32).

Silicide layers 56 are preferably provided over both regions 22 and 24, but may alternatively be provided over only regions 22 or only region 24. The recessed nature of regions 22 and 24 allows sufficient material for the formation of layers 56, thereby reducing sheet resistance associated with transistor 12. Layers 56 generally require that regions 22 and 24 have a thickness of at least 350 Å.

In this exemplary embodiment, regions 22 and 24 are recessed in that a bottom 29 of regions 22 and 24 is below a bottom 31 of a channel region 37. Preferably, bottom 29 is 300–550 Å below bottom 31. Channel 37 is situated above insulating material 35 (e.g., an oxide island). A top of material 35 is coincident with bottom 31 of channel region 37.

Transistor 12 achieves substantial immunity to short-channel effects and reduced sub-threshold slope since channel region 37 is less than 200 Å thick, preferably between 50 and 100 Å. Short-channel effects can degrade the performance of transistor 12 as well as the manufacturability of the IC associated with transistor 12. Channel region 37 is also preferably less than 50 nm wide (gate length less than 50 nm).

Regions 22 and 24 have a concentration of $10^{19}$ to $10^{20}$ dopants per cubic centimeter. An appropriate dopant for a P-channel transistor is boron, boron diflouride, or iridium, and an appropriate dopant for an N-type transistor is arsenic, phosphorous, or antimony.

Gate stack or structure 18 includes a pair of spacers 32, gate oxide 34, and a gate conductor 36. Spacers 32 can be silicon nitride ($Si_3N_4$), silicon dioxide ($SiO_2$) or other insulative material. Spacers 32 are preferably 800–1000 Å high, 100–200 Å wide and are made of a silicon dioxide material. Gate oxide 34 is preferably thermally grown silicon dioxide on substrate 14 and is 15–20 Å thick.

Gate conductor 36 is preferably deposited by chemical vapor deposition (CVD) and etched to form the particular structure for transistor 12. Spacers 32 are preferably deposited over conductor 36 by CVD and planarized or etched to leave spacers 32 having a width of 100–200 Å.

Conductor 36 is preferably a polysilicon material heavily doped with N-type dopants and 25–100 nm wide. A silicide layer 42 can be provided over conductor 36. Gate structure 18 has a height or thickness of 800–1000 Å measured from top surface 27 of layer 15 to the top surface of layer 42. Layer 42 can be 400–500 Å thick from its bottom surface to its top surface.

Gate structure 18 is disposed over channel region 37 (e.g., above material 35). Channel region 37 is an ultra-thin body channel and has a thickness less than 200 Å which reduces the susceptibility of transistor 12 to short channel affects such as voltage roll-off and drain-induced barrier lowering. Channel region 37 is located between regions 22 and 24 and underneath gate oxide 34 and can be 800–1200 Å wide preferably less than 50 nm wide for ultra high density. Region 37 is as thick as the difference in thickness between layer 15 (as shown in FIG. 1) associated with substrate 14 and material 35.

Transistor 12 is disposed between isolation regions 52 in layer 15 of substrate 14. Isolation regions 52 are preferably oxide structures which separate transistor 12 from neighboring transistors or other circuit elements. Regions 52 can be formed in a local oxidation of silicon (LOCOS) process, a shallow trench isolation (STI) process, or other insulative structure formation process.

Regions 52 have a T-shape as a result of the fabrication process described below. A wider section 53 is located nearer top surface 27 and is approximately 1 micron wide. Wider section 53 is disposed over narrower section 57 which is between 2000–5000 Å wide. Section 57 is 300–500 Å thick and section 53 is 50–100 Å thick.

Transistor 12 can be an N-channel or a P-channel field effect transistor, such as, a metal oxide semiconductor field effect transistor (MOSFET). Transistor 12 can be at least partially covered by an insulative layer and is preferably part of an ultra-large scale integrated (ULSI) circuit that includes one million or more transistors. Regions 22 and 24 have a concentration of $5 \times 10^{19}$–$1 \times 10^{20}$ dopants per cubic centimeter.

With reference to FIGS. 1–7, a method of manufacturing a transistor 12, including recessed source region 22 and recessed drain region 24, on an SOI substrate 14 will now be described. The advantageous process allows recessed source and drain regions 22 and 24, to be thick enough to accommodate layers 56 and yet have channel region 37 which is less than 150 Å (ultra-thin body for transistor 12).

Figure 2:
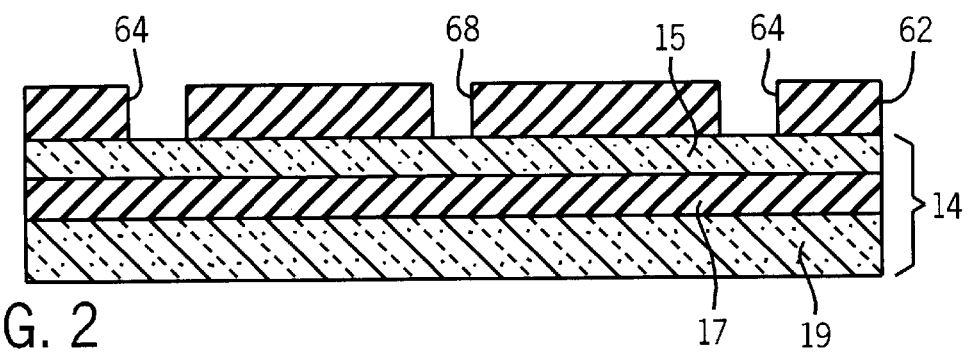
FIG. 2 is a cross-sectional view of the portion of the substrate illustrated in FIG. 1, showing a photoresist patterning step.

In FIG. 2, substrate 14 is a semiconductor-on-insulator (SOI) substrate including semiconductor film or layer 15, buried oxide layer 17, and substrate 19. Substrate 19 is preferably silicon. Layer 15 is preferably a 500–700 Å thick silicon film disposed over a buried silicon oxide layer such as layer 17.

A photoresist layer 62 is deposited over layer 15 by any conventional technique. Layer 62 is preferably conventionally configured via a photolithographic process to have wide apertures 64 and at least one narrow aperture 68. Apertures 64 correspond to narrower sections 57 of insulative structures 52 (FIG. 1) and are approximately 2000–5000 Å wide. Narrow aperture 68 is preferably a narrow window with a width of 800–1200 Å and corresponds to material 35 above the active area or channel region 37 (FIG. 1). Apertures 64 and 68 are preferably formed in a conventional photolithographic curing and removal process.

Figure 3:
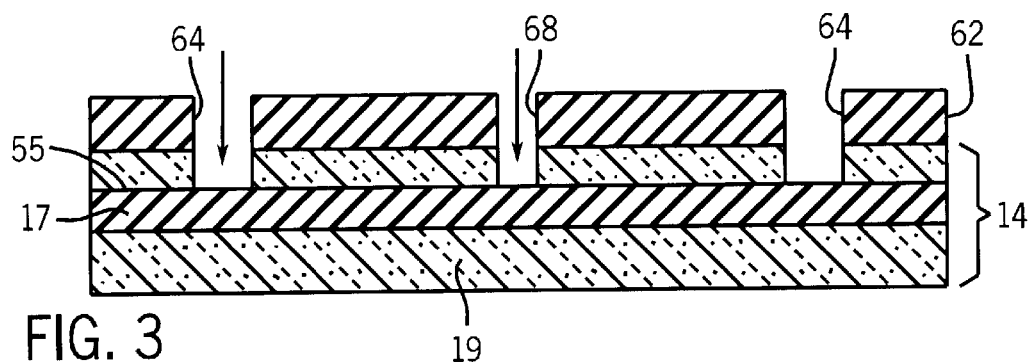
FIG. 3 is a cross-sectional view of the portion of the substrate illustrated in FIG. 2, showing a semiconductor etching step.

In FIG. 3, substrate 14 is etched in accordance with apertures 64 and 68. Preferably, a dry etching process selective to silicon is utilized to extend apertures 64 and 68 to reach top surface 55 of layer 17. Preferably, apertures 64 and 68 extend completely through layer 15. Accordingly, layer 15 includes trenches associated with apertures 64 and 68. The trenches can be formed in any semiconductor removal process, although dry etching is preferred. Alternatively, a hard mask etching process can be used to form the trenches.

Figure 4:
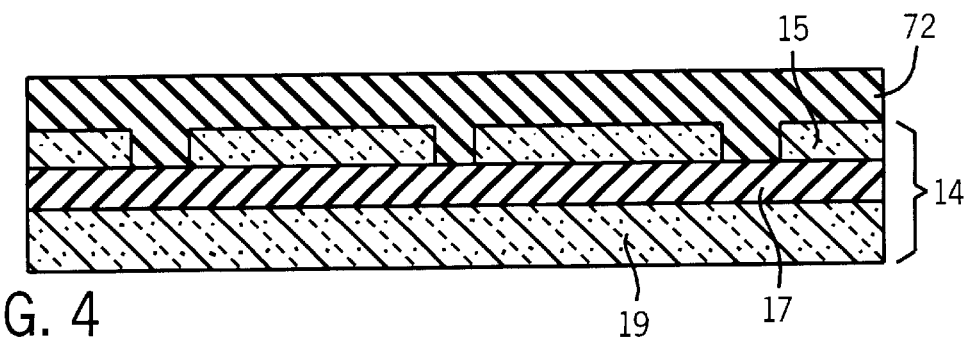
FIG. 4 is a cross-sectional view of the portion of the substrate illustrated in FIG. 3, showing an insulating layer depositing step.

In FIG. 4, photoresist layer 62 is stripped or removed. After layer 62 is removed, an insulative layer 72 is deposited over layer 15 and within the trenches associated with apertures 64 and 68 (FIG. 3). Preferably, the insulative material is deposited as a 2000–3000 Å thick silicon dioxide material. A chemical vapor deposition (CVD) tetraethylorthosilicate (TEOS) process can be utilized to provide layer 72. Preferably, layer 72 is silicon dioxide. Conformal deposition may be utilized to ensure that the trenches associated with apertures 64 and 68 are completely filled.

Figure 5:
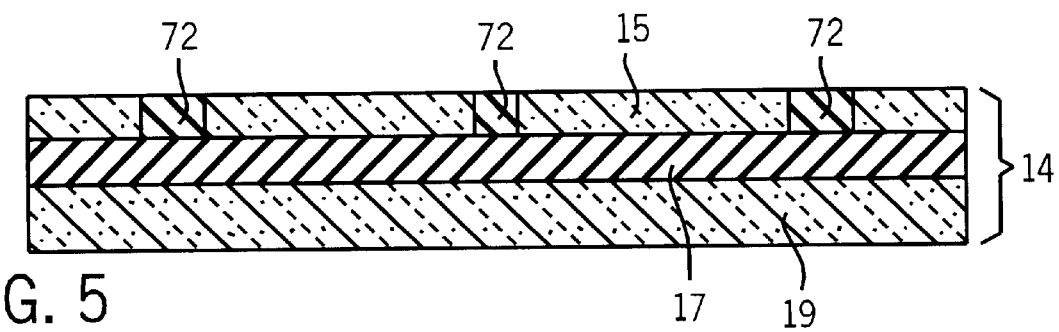
FIG. 5 is a cross-sectional view of the portion of the substrate illustrated in FIG. 4, showing a chemical mechanical polishing (CMP) step.

In FIG. 5, layer 72 is removed from above layer 15. However, portions of layer 72 remain in the trenches associated with apertures 64 and 68 (FIG. 3). Therefore, the portions of layer 72 remaining in trenches associated with apertures 64 and 68 form insulating islands in layer 15. The portions of layer 72 remaining in the trenches associated with apertures 64 becomes narrower sections 57 of insulative structure 52 (FIG. 1). The portions of layer 72 remaining in the trench associated with aperture 68 (FIG. 3) becomes material 35 below channel region 37 (FIG. 1).

Layer 72 can be selectively removed to leave portions in the trenches by a number of processes. In this exemplary embodiment, layer 72 is removed by chemical mechanical polish (CMP) until material (e.g., silicon) associated with layer 15 is exposed. Preferably, once layer 15 is exposed, substrate 14 is subjected to an overpolish to reduce the thickness of layer 15 from 500–700 Å to 300–500 Å. Regions of layer 15 which surround layer 72 in the trench associated with aperture 68 are associated with the recessed nature of source and drain regions 22 and 24 (FIG. 1).

Figure 6:
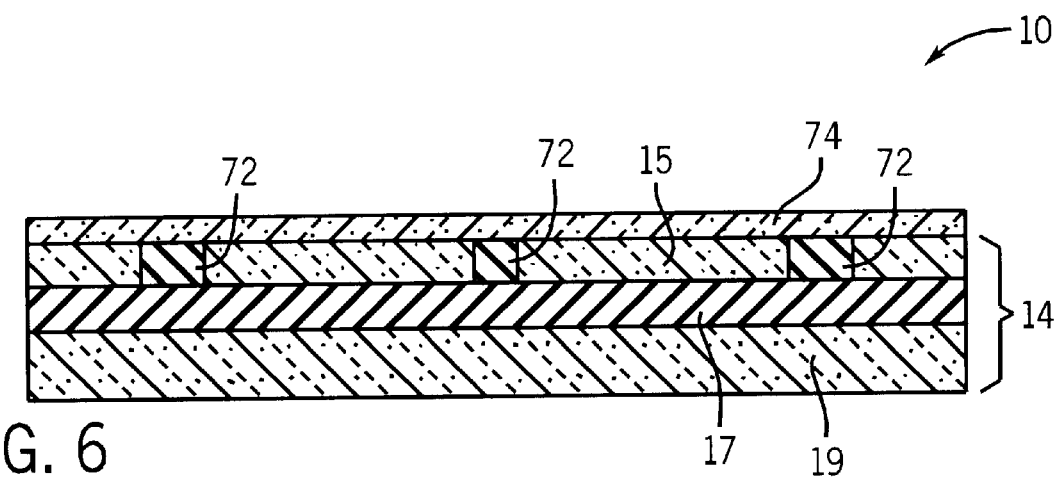
FIG. 6 is a cross-sectional view of the portion of the substrate illustrated in FIG. 5, showing a semiconductor deposition step.

In FIG. 6, after polishing layer 15, a thin semiconductor layer 74 is deposited over layer 72 remaining in the trenches associated with apertures 64 and 68 and over film 15. Preferably, layer 74 is a 50–100 Å amorphous semiconductor layer.

In a preferred embodiment, layer 74 is an amorphous silicon layer. Layer 74 can be deposited in a low pressure chemical vapor deposition process. The deposition temperature is preferably 450–550° Celsius.

Figure 7:
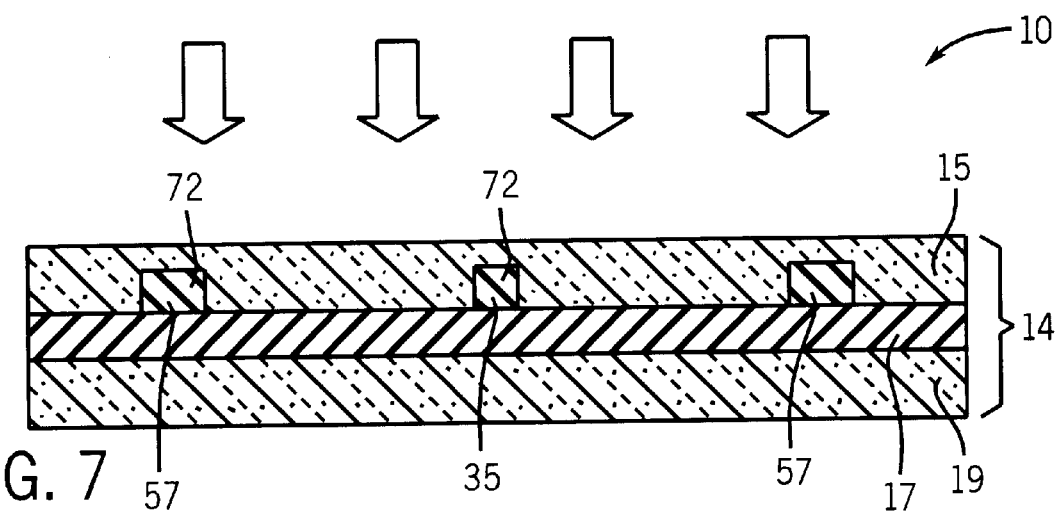
FIG. 7 is a cross-sectional view of the portion of the substrate illustrated in FIG. 6, showing an annealing step.

In FIG. 7, after deposition of layer 74, substrate 14 is subject to an annealing process. Preferably, the annealing process is an excimer laser annealing process. The annealing process is preferably sufficient to completely melt an amorphous silicon layer such as layer 74. Layer 74 is recrystallized after the laser beam associated with the excimer laser exposure is removed. Layer 74 is recrystallized as a single crystal silicon layer such as layer 15 (FIG. 1). The temperature of the surface of layer 74 reaches 1100° C. during annealing.

In FIG. 1, an additional trench isolation step is performed to complete isolation structures 52 (e.g., to form wider sections 53). Preferably, a conventional trench isolation technique is utilized in which layer 74 is etched.

Transistor 12 can be substantially formed by conventional semiconductor processing techniques to include gate structure 18. Gate structure 18 is comprised of gate oxide 34, and gate conductor 36. Gate conductor 36 is 800–1000 Å thick and is configured with a proper work function for transistor 12.

Spacers 32 abut gate structure 18 and are formed in a conventional deposition and etch-back process. Spacers 32 are preferably 100–200 Å wide and 800–1000 Å thick. Conventional SOI MOS fabrication processing can be utilized to form contacts, interconnects and interlevel dielectrics. Regions 22 and 24 can be doped in conventional doping processes. Alternatively, doping can be accomplished utilizing amorphous doping techniques.

After doping, layers 56 and 42 can be formed. Layers 56 and 42 are formed after structure 18 is formed in this exemplary embodiment. Preferably, layers 56 and 42 are formed using conventional silicidation processes. Layers 42 and 56 can be titanium silicide ($TiSi_2$), nickel silicide ($NiSi_2$), cobalt silicide ($CoSi_2$), or other conductive materials. Generally, 70 percent of layers 56 (245–420 Å) are below top surface 27 of layer 15. Recessed source and drain regions 22 and 24 including layers 56 preferably have a final thickness of 350–700 Å while channel region 37 has a final thickness of 100 Å or less.

It is understood that while the detailed drawings, specific examples, and particular values given provide a preferred exemplary embodiment of the present invention, the preferred exemplary embodiment is for the purpose of illustration only. The method and apparatus of the invention is not limited to the precise details and conditions disclosed. For example, although germanium ion amorphous silicon is utilized to create a recessed structure, other materials and techniques can be utilized. Various changes may be made to the details disclosed without departing from the spirit of the invention which is defined by the following claims.

What is claimed is:

1. A method of manufacturing an integrated circuit including a transistor disposed on a substrate including a thin film, the method comprising:

forming at least one of a recessed source region and a recessed drain region on the substrate; and siliciding the at least one of the recessed source region and the recessed drain region, wherein the forming step includes depositing a semiconductor material over the thin film, wherein the semiconductor material is amorphous silicon and the forming step further includes annealing the amorphous silicon, wherein the annealing step comprises a low thermal budget annealing step, and wherein the recessed source and drain regions are 350–600 Å thick and a channel region is less than 100 Å thick.

2. The method of claim 1, wherein the forming step includes etching an aperture in the thin film and filling the aperture with an insulator.

3. The method of claim 1, wherein the semiconductor material includes silicon.

4. The method of claim 1, wherein the semiconductor material is amorphous silicon and the forming step further includes annealing the amorphous silicon in an excimer laser process.

5. The method of claim 4, further comprising:

forming T-shaped isolation regions, the transistor being located between the isolation regions.

6. The method of claim 5, wherein the channel region is between 50 and 100 Å thick.

7. The method of claim 1, wherein the substrate comprises a silicon-on-insulator substrate.

8. The method of claim 7, wherein the substrate includes the thin film over a buried oxide layer over a silicon base.

9. The method of claim 1, wherein a gate structure is provided after the forming step and before the siliciding step.

10. A method of manufacturing a ULSI circuit on a semiconductor-on-insulator substrate, the method comprising:

selectively etching a semiconductor film to form an aperture, wherein the semiconductor film is 500–700 Å thick;

providing an insulating material in the aperture;

polishing the semiconductor film to a thickness of approximately 300–500 Å thick after providing the insulating material step;

providing a semiconductor layer over the insulating material and the semiconductor film; and providing a gate on the semiconductor layer at a location above the insulating material, wherein the semiconductor layer is 50–100 Å thick, wherein a source or a drain is 350–600 Å thick.

11. The method of claim 10, wherein the semiconductor layer is amorphous silicon.

12. The method of claim 11, wherein the source and the drain are located between two T-shaped isolation structures.

13. The method of claim 10, wherein the semiconductor film is single crystalline silicon.

14. The method of claim 10, wherein a channel region above the insulating material is less than 100 Å thick.

15. The method of claim 10, wherein the gate is polysilicon.

16. The method of claim 15, wherein the gate and the semiconductor layer are at least partially silicided.

17. A method of fabricating a transistor or semiconductor-on-insulator substrate, the transistor including a gate disposed between a recessed source region and a recessed drain region, wherein a channel is disposed below the gate and between the recessed drain region and the recessed source region, the channel being less than 100 Å thick and the recessed drain region and the source region being thicker than the channel, the method comprising:

selectively etching a semiconductor film to form an aperture;

providing an insulating material in the aperture;

providing a semiconductor layer over the insulating material and the semiconductor film; and providing a gate on the semiconductor layer at a location above the insulating material, wherein the semiconductor layer is 50–100 Å thick, wherein a source or a drain is 350–600 Å thick.

18. The method of claim 17, wherein the channel is less than 100 Å thick.

19. The integrated circuit of claim 17, wherein the insulative material is about 800–1200 Å wide.

* * * * *

UNITED STATES PATENT AND TRADEMARK OFFICE
CERTIFICATE OF CORRECTION

PATENT NO. : 6,420,218 B1
DATED : July 16, 2002
INVENTOR(S) : Bin Yu

It is certified that error appears in the above-identified patent and that said Letters Patent is hereby corrected as shown below:

Column 8,
Lines 18-19, delete "the semiconductor material is amorphous silicon and".
Line 60, delete "or" and insert therefor -- on a --.

Column 9,
Line 6, delete "a" before "gate" and insert therefor -- the --.

Column 10,
Line 1, delete "a" before "source" and insert therefor -- the recessed --.
Line 1, delete "a" before "drain" and insert therefor -- the recessed --.

Signed and Sealed this

Second Day of September, 2003

JAMES E. ROGAN
*Director of the United States Patent and Trademark Office*